(12) United States Patent
Nakajima

(10) Patent No.: US 11,584,320 B2
(45) Date of Patent: Feb. 21, 2023

(54) PHYSICAL QUANTITY DETECTION CIRCUIT, PHYSICAL QUANTITY SENSOR, ELECTRONIC APPARATUS, VEHICLE, AND METHOD FOR MALFUNCTION DIAGNOSIS ON PHYSICAL QUANTITY SENSOR

(71) Applicant: Seiko Epson Corporation, Tokyo (JP)

(72) Inventor: Kiminori Nakajima, Shiojiri (JP)

(73) Assignee: SEIKO EPSON CORPORATION

( * ) Notice: Subject to any disclaimer, the term of this patent is extended or adjusted under 35 U.S.C. 154(b) by 315 days.

(21) Appl. No.: 16/912,759

(22) Filed: Jun. 26, 2020

(65) Prior Publication Data
US 2020/0406846 A1 Dec. 31, 2020

(30) Foreign Application Priority Data

Jun. 27, 2019 (JP) .............................. JP2019-119441

(51) Int. Cl.
*B60R 21/01* (2006.01)
*H03M 1/10* (2006.01)
*H03M 1/12* (2006.01)

(52) U.S. Cl.
CPC ........... *B60R 21/01* (2013.01); *H03M 1/1076* (2013.01); *H03M 1/12* (2013.01); *B60R 2021/01184* (2013.01)

(58) Field of Classification Search
CPC ........... B60R 21/01; B60R 2021/01184; B60R 21/0132; H03M 1/1076; H03M 1/12;
(Continued)

(56) References Cited

U.S. PATENT DOCUMENTS 4,580,126 A * 4/1986 Kato ..................... H03M 1/109
341/120
5,742,513 A * 4/1998 Bouhenguel ....... G01R 31/3278
702/123

(Continued)

FOREIGN PATENT DOCUMENTS

CN 108664347 A 10/2018
EP 1251507 A2 * 10/2002 ....... G11B 20/10027
(Continued)

*Primary Examiner* — Mary Cheung
(74) *Attorney, Agent, or Firm* — Harness, Dickey & Pierce, P.L.C.

(57) ABSTRACT

A physical quantity detection circuit includes: a detection signal generation circuit generating a detection signal, based on an output signal from a physical quantity detection element; an analog/digital converter circuit converting the detection signal into a first digital signal and converting a test signal into a second digital signal; a test signal generation circuit generating the test signal; and a malfunction diagnosis circuit diagnosing a malfunction of the analog/digital converter circuit, based on the second digital signal. A full-scale voltage of the analog/digital converter circuit is selected from among a plurality of voltages having different magnitudes, according to a power supply voltage. The test signal includes an upper limit value test signal, a lower limit value test signal, and a first intermediate value test signal. The test signal generation circuit performs resistive voltage division of the full-scale voltage and thus generates the first intermediate value test signal.

15 Claims, 6 Drawing Sheets

(58) Field of Classification Search
CPC ......... H03M 1/122; H03M 1/38; G01P 21/00;
G01P 21/02; G01C 25/005
See application file for complete search history.

(56) References Cited

U.S. PATENT DOCUMENTS

| | | | |
|---|---|---|---|
| 10,084,464 B1* | 9/2018 | Shimauchi | H03M 1/0678 |
| 2005/0248477 A1* | 11/2005 | Jongsma | H03M 1/1076 |
| | | | 341/110 |
| 2009/0073019 A1* | 3/2009 | Ooi | H03M 1/1042 |
| | | | 341/158 |
| 2010/0083757 A1 | 4/2010 | Uemura | |
| 2010/0149007 A1 | 6/2010 | Zushi et al. | |
| 2014/0118174 A1 | 5/2014 | Arai et al. | |
| 2017/0019120 A1* | 1/2017 | Mallett | H03M 3/458 |
| 2018/0287625 A1 | 10/2018 | Murashima | |
| 2019/0170594 A1 | 6/2019 | Aoyama | |

FOREIGN PATENT DOCUMENTS

| | | | |
|---|---|---|---|
| JP | H08-056160 A | | 2/1996 |
| JP | 2000323990 A | * | 11/2000 |
| JP | 2005-175790 A | | 6/2005 |
| JP | 2010-141807 A | | 6/2010 |
| JP | 2013038717 A | * | 2/2013 |
| JP | 2014-090362 A | | 5/2014 |
| JP | 2018-165641 A | | 10/2018 |
| JP | 2018-166274 A | | 10/2018 |

\* cited by examiner

PHYSICAL QUANTITY DETECTION CIRCUIT, PHYSICAL QUANTITY SENSOR, ELECTRONIC APPARATUS, VEHICLE, AND METHOD FOR MALFUNCTION DIAGNOSIS ON PHYSICAL QUANTITY SENSOR

The present application is based on, and claims priority from JP Application Serial Number 2019-119441, filed Jun. 27, 2019, the disclosure of which is hereby incorporated by reference herein in its entirety.

BACKGROUND

1. Technical Field

The present disclosure relates to a physical quantity detection circuit, a physical quantity sensor, an electronic apparatus, a vehicle, and a method for malfunction diagnosis on a physical quantity sensor.

2. Related Art

Currently, a physical quantity sensor that can detect various physical quantities, such as a gyro sensor detecting an angular velocity or an acceleration sensor detecting an acceleration, is broadly used in various systems and electronic apparatuses. Recently, a physical quantity sensor outputting physical quantity detection information as digital data with a high noise resistance is used particularly in order to construct a highly reliable system. Generally, such a physical quantity sensor has a physical quantity detection element, and a physical quantity detection circuit which generates an analog signal corresponding to a detected physical quantity based on a signal outputted from the physical quantity detection element, converts the analog signal into a digital signal via an A/D converter circuit, and subsequently performs digital signal processing.

JP-A-8-56160 describes an AD converter abnormality detection device which changes the voltage value of a test signal inputted to an AD converter, determines whether an actual output value from the AD converter coincides with a normal output value from the AD converter stored in advance corresponding to the voltage value of the test signal, and determines that the AD converter has an abnormality when these output values do not coincide with each other.

Developing a plurality of types of physical quantity detection circuits corresponding to the types of power supply voltages increases the cost. Therefore, a physical quantity detection circuit that can operate when any one of a plurality of power supply voltages is inputted to a power supply terminal is recently developed in order to restrain the development cost. Meanwhile, when an impact is applied to the physical quantity sensor and voltage saturation of the input signal to the A/D converter circuit occurs, the digital signal outputted from the A/D converter circuit is stuck at an upper limit value. This may cause malfunctioning of the system or electronic apparatus that performs processing based on the digital signal outputted from the physical quantity sensor. To restrain the voltage saturation of the input signal to the A/D converter circuit even when an impact is applied, it is preferable that the A/D converter circuit has a broad dynamic range. Therefore, in the physical quantity detection circuit that can operate when any one of a plurality of power supply voltages is inputted, the full-scale voltage of the A/D converter needs to be changed according to the inputted power supply voltage and a dynamic range as broad as possible needs to be secured.

However, in such a physical quantity sensor, when a test signal having an intermediate voltage that is lower than the full-scale voltage is inputted to the A/D converter circuit in order to increase the accuracy of malfunction diagnosis, at least one of the voltage value of the test signal and the determination value of the digital signal outputted from the A/D converter circuit needs to be changed according to the full-scale voltage. When the voltage value of the test signal is variable, a large test signal generation circuit is needed. When the determination value is variable, a large malfunction diagnosis circuit is needed. Therefore, the circuit scale of the physical quantity detection circuit may need to be increased.

SUMMARY

A physical quantity detection circuit according to an aspect of the present disclosure includes: a detection signal generation circuit generating a detection signal corresponding to a physical quantity, based on an output signal from a physical quantity detection element detecting the physical quantity; an analog/digital converter circuit converting the detection signal into a first digital signal and converting a test signal into a second digital signal; a test signal generation circuit generating the test signal; and a malfunction diagnosis circuit diagnosing a malfunction of the analog/digital converter circuit, based on the second digital signal. A full-scale voltage of the analog/digital converter circuit is selected from among a plurality of voltages having different magnitudes, according to a power supply voltage. The test signal includes an upper limit value test signal for turning a value of an output signal from the analog/digital converter circuit into an upper limit value, a lower limit value test signal for turning the value of the output signal from the analog/digital converter circuit into a lower limit value, and a first intermediate value test signal for turning the value of the output signal from the analog/digital converter circuit into a value between the upper limit value and the lower limit value. The test signal generation circuit performs resistive voltage division of the full-scale voltage and thus generates the first intermediate value test signal.

In the physical quantity detection circuit according to the aspect, the malfunction diagnosis circuit may diagnose that the analog/digital converter circuit has a malfunction, when the value of the second digital signal converted from the upper limit value test signal by the analog/digital converter circuit does not coincide with the upper limit value. The malfunction diagnosis circuit may diagnose that the analog/digital converter circuit has a malfunction, when the value of the second digital signal converted from the lower limit value test signal by the analog/digital converter circuit does not coincide with the lower limit value. The malfunction diagnosis circuit may diagnose that the analog/digital converter circuit has a malfunction, when the value of the second digital value converted from the first intermediate value test signal by the analog/digital converter circuit is not included in a first range between the upper limit value and the lower limit value.

In the physical quantity detection circuit according to the aspect, the first range may be constant regardless of a magnitude of the full-scale voltage.

In the physical quantity detection circuit according to the aspect, the test signal may further include a second intermediate value test signal for turning the value of the output signal from the analog/digital converter circuit into a value between the upper limit value and the lower limit value. The first intermediate value test signal and the second intermediate value test signal may have different voltage values from each other. The test signal generation circuit may perform resistive voltage division of the full-scale voltage and thus generate the second intermediate value test signal.

In the physical quantity detection circuit according to the aspect, the malfunction diagnosis circuit may diagnose that the analog/digital converter circuit has a malfunction, when the value of the second digital signal converted from the second intermediate value test signal by the analog/digital converter circuit is not included in a second range between the upper limit value and the lower limit value.

In the physical quantity detection circuit according to the aspect, the second range may be constant regardless of a magnitude of the full-scale voltage.

The physical quantity detection circuit according to the aspect may further include a regulator circuit generating a voltage selected from among a plurality of voltages having different magnitudes from each other, according to the power supply voltage, and outputting the generated voltage as a reference voltage of the analog/digital converter circuit. The full-scale voltage may be set based on the reference voltage.

A physical quantity sensor according to another aspect of the present disclosure includes: the physical quantity detection circuit according to the foregoing aspect; and the physical quantity detection element.

An electronic apparatus according to another aspect of the present disclosure includes: the foregoing physical quantity sensor; and a processing circuit performing processing based on an output signal from the physical quantity sensor.

A vehicle according to another aspect of the present disclosure includes: the foregoing physical quantity sensor; and a processing circuit performing processing based on an output signal from the physical quantity sensor.

A method for malfunction diagnosis on a physical quantity sensor according to another aspect of the present disclosure is a method for malfunction diagnosis on a physical quantity sensor including a physical quantity detection element detecting a physical quantity, a detection signal generation circuit generating a detection signal corresponding to the physical quantity, based on an output signal from the physical quantity detection element, and an analog/digital converter circuit converting the detection signal into a first digital signal. A full-scale voltage of the analog/digital converter circuit is selected from among a plurality of voltages having different magnitudes from each other, according to a power supply voltage. The method includes: a test signal generation step of generating a test signal; an analog/digital conversion step of converting the test signal into a second digital signal having the voltage selected according to the power supply voltage, as the full-scale voltage, by the analog/digital converter circuit; and a malfunction diagnosis step of diagnosing a malfunction of the analog/digital converter circuit, based on the second digital signal. The test signal includes an upper limit value test signal for turning a value of an output signal from the analog/digital converter circuit into an upper limit value, a lower limit value test signal for turning the value of the output signal from the analog/digital converter circuit into a lower limit value, and a first intermediate value test signal for turning the value of the output signal from the analog/digital converter circuit into a value between the upper limit value and the lower limit value. In the test signal generation step, resistive voltage division of the full-scale voltage is performed to generate the first intermediate value test signal.

DESCRIPTION OF EXEMPLARY EMBODIMENTS

Preferred embodiments of the present disclosure will now be described in detail with reference to the drawings. The embodiments described below should not unduly limit the content of the present disclosure described in the appended claims. Not all the components described below are essential elements of the present disclosure.

A physical quantity sensor detecting an angular velocity and an acceleration as physical quantities will now be described as an example.

1. Physical Quantity Sensor 1-1. Configuration of Physical Quantity Sensor

Figure 1:
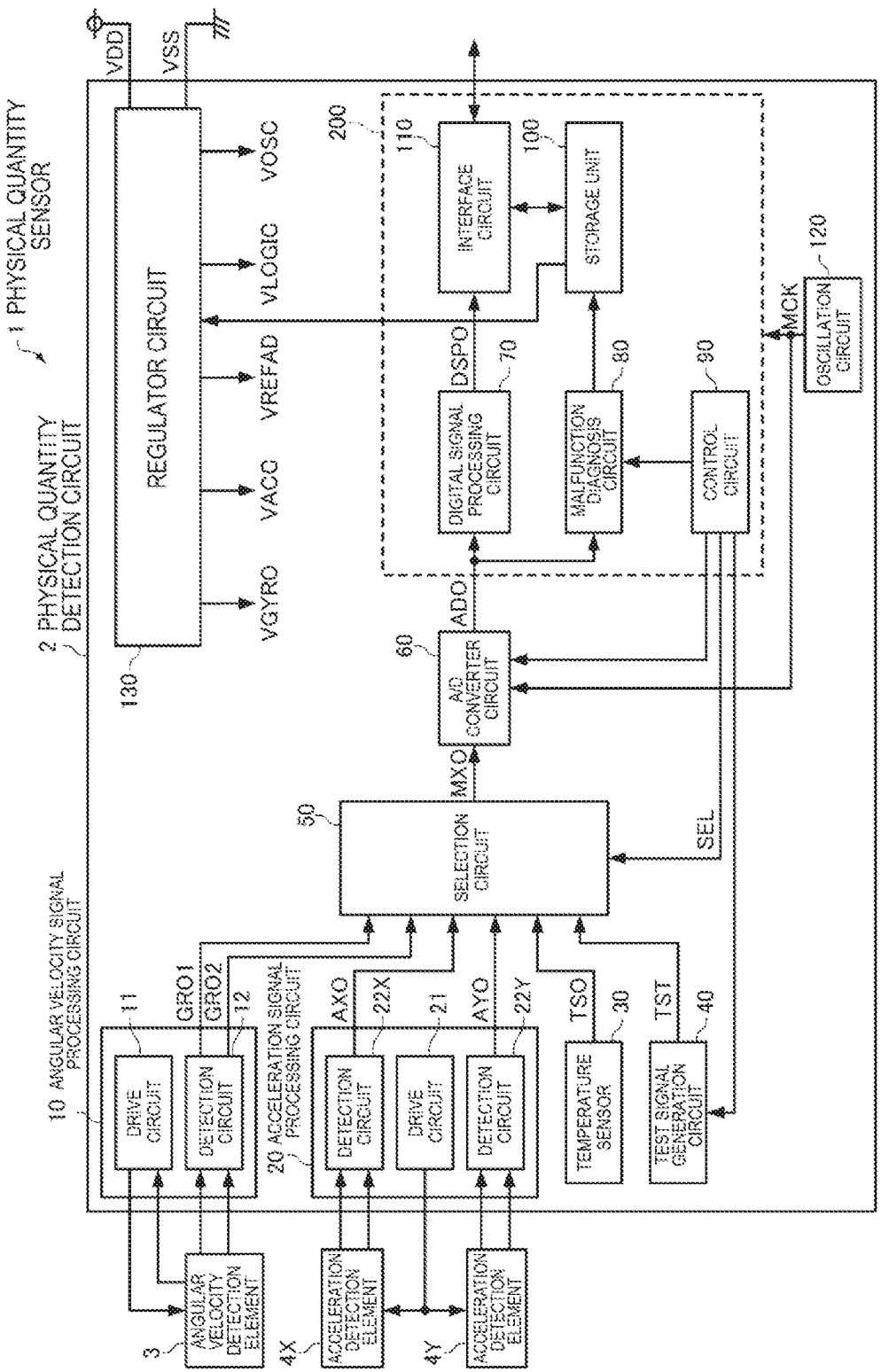
FIG. 1 is a functional block diagram of a physical quantity sensor according to an embodiment.

FIG. 1 is a functional block diagram of a physical quantity sensor according to an embodiment. A physical quantity sensor 1 according to this embodiment has a physical quantity detection circuit 2, an angular velocity detection element 3, an acceleration detection element 4X, and an acceleration detection element 4Y.

The acceleration detection elements 4X, 4Y are physical quantity detection elements detecting an acceleration as a physical quantity. The acceleration detection element 4X detects an acceleration in a direction along an X-axis. The acceleration detection element 4Y detects an acceleration in a direction along a Y-axis orthogonal to the X-axis. For example, the acceleration detection elements 4X, 4Y may be elements which have an electrostatic capacitor where a drive electrode and a detection electrode arranged, not illustrated, in which the amount of electric charge of the electrostatic capacitor changes according to the acceleration, and which output a signal corresponding to the amount of electric charge. For example, the acceleration detection elements 4X, 4Y may be MEMS (micro-electromechanical system) elements.

The angular velocity detection element 3 is a physical quantity detection element detecting an angular velocity as a physical quantity. In this embodiment, the angular velocity detection element 3 detects an angular velocity about a Z-axis orthogonal to the X-axis and the Y-axis. For example, the angular velocity detection element 3 may be an element which has a vibrator element where a drive electrode and a detection electrode are arranged, not illustrated, in which the magnitude of the vibration of the vibrator element changes according to the angular velocity, and which outputs a signal corresponding to the magnitude of the vibration. For example, angular velocity detection element 3 may be an element having so-called double-T quartz crystal vibrator element having two T-shape drive vibrating arms.

The physical quantity detection circuit 2 includes an angular velocity signal processing circuit 10, an acceleration signal processing circuit 20, a temperature sensor 30, a test signal generation circuit 40, a selection circuit 50, an analog/digital converter circuit 60, a digital signal processing circuit 70, a malfunction diagnosis circuit 80, a control circuit 90, a storage unit 100, an interface circuit 110, an oscillation circuit 120, and a regulator circuit 130. The physical quantity detection circuit 2 may be implemented, for example, by a one-chip integrated circuit (IC). A part of the components of the physical quantity detection circuit 2 may be omitted or changed. Also, another component may be added.

The regulator circuit 130 generates a reference voltage VGYRO, a reference voltage VACC, a reference voltage VREFAD, a reference voltage VLOGIC, and a reference voltage VOSC, based on a power supply voltage VDD and a ground voltage VSS supplied from outside the physical quantity detection circuit 2. The regulator circuit 130 also generates various common voltages, based on the power supply voltage VDD and the ground voltage VSS.

In this embodiment, the physical quantity detection circuit 2 can select a plurality of voltages as the power supply voltage VDD supplied thereto. The regulator circuit 130 generates a voltage selected from a plurality of voltages having different magnitudes, according to the power supply voltage VDD, and outputs the generated voltage as the reference voltage VREFAD of the analog/digital converter circuit 60. For example, power supply voltage selection information for selecting the power supply voltage VDD is sored in a non-volatile memory, not illustrated, provided in the storage unit 100. The regulator circuit 130 generates the reference voltage VREFAD based on the power supply voltage selection information. For example, when 5 V or 3.3 V is selectable as the power supply voltage VDD based on the power supply voltage selection information and 5 V is selected as the power supply voltage VDD, the regulator circuit 130 may generate a reference voltage VREFAD of 4.2 V. When 3.3 V is selected as the power supply voltage VDD, the regulator circuit 130 may generate a reference voltage VREFAD of 2.7 V.

The oscillation circuit 120 operates with the reference voltage VOSC as the power supply voltage and generates a clock signal MCK. The oscillation circuit 120 may be configured, for example, as a ring oscillator or CR oscillation circuit.

The angular velocity signal processing circuit 10 includes a drive circuit 11 and a detection circuit 12 and operates with the reference voltage VGYRO as the power supply voltage.

The drive circuit 11 generates a drive signal to cause the angular velocity detection element 3 to perform excited vibration and supplies the drive signal to the angular velocity detection element 3. The drive circuit 11 takes in an oscillation current generated by the excited vibration of the angular velocity detection element 3 and performs feedback control on the amplitude level of the drive signal in such a way that the amplitude of the oscillation current is kept constant. When an angular velocity about the Z-axis is applied to the angular velocity detection element 3 in the state of performing excited vibration, the angular velocity detection element 3 detects this angular velocity and outputs a signal corresponding to the angular velocity. In this embodiment, the signal outputted from the angular velocity detection element 3 is a differential signal.

The detection circuit 12 is a detection signal generation circuit generating a detection signal corresponding to an angular velocity about the Z-axis, based on an output signal from the angular velocity detection element 3. Specifically, the detection circuit 12 detects an angular velocity component included in a signal outputted from the angular velocity detection element 3 and generates and outputs an angular velocity detection signal GRO1 of a voltage level corresponding to the magnitude of the angular velocity component. The detection circuit 12 also detects a vibration leakage component included in the signal outputted from the angular velocity detection element 3 and generates and outputs a vibration leakage signal GRO2 of a voltage level corresponding to the magnitude of the vibration leakage component. In this embodiment, each of the angular velocity detection signal GRO1 and the vibration leakage signal GRO2 is a differential signal.

The acceleration signal processing circuit 20 includes a drive circuit 21, a detection circuit 22X, and a detection circuit 22Y, and operates with the reference voltage VACC as the power supply voltage.

The drive circuit 21 generates a carrier signal, outputs the carrier signal to the acceleration detection elements 4X, 4Y, and thus drives the acceleration detection elements 4X, 4Y. When an acceleration in a direction along the X-axis is applied in this state, the acceleration detection element 4X detects this acceleration and outputs a signal corresponding to the acceleration. When an acceleration in a direction along the Y-axis is applied, the acceleration detection element 4Y detects this acceleration and outputs a signal corresponding to the acceleration. In this embodiment, the signal outputted from each of the acceleration detection elements 4X, 4Y is a differential signal.

The detection circuit 22X is a detection signal generation circuit generating a detection signal corresponding to an acceleration in a direction along the X-axis, based on an output signal from the acceleration detection element 4X. Specifically, the detection circuit 22X detects an acceleration component included in a signal outputted from the acceleration detection element 4X and generates and outputs an X-axis acceleration detection signal AXO of a voltage level corresponding to the magnitude of the acceleration component. In this embodiment, the X-axis acceleration detection signal AXO is a differential signal.

The detection circuit 22Y is a detection signal generation circuit generating a detection signal corresponding to an acceleration in a direction along the Y-axis, based on an output signal from the acceleration detection element 4Y. Specifically, the detection circuit 22Y detects an acceleration component included in a signal outputted from the acceleration detection element 4Y and generates and outputs a Y-axis acceleration detection signal AYO of a voltage level corresponding to the magnitude of the acceleration component. In this embodiment, the Y-axis acceleration detection signal AYO is a differential signal.

The temperature sensor 30 detects a temperature and outputs a temperature detection signal TSO of a voltage level corresponding to the temperature. For example, the temperature sensor 30 may be a circuit utilizing the temperature characteristic of a bandgap reference circuit. In this embodiment, the temperature detection signal TSO is a differential signal.

The test signal generation circuit 40 generates and outputs a test signal TST, based on a control signal from the control circuit 90. As will be described later, the test signal TST is used for malfunction diagnosis on the analog/digital converter circuit 60. In this embodiment, the test signal TST is a differential signal.

The selection circuit 50 selects and outputs one of the angular velocity detection signal GRO1, the vibration leakage signal GRO2, the X-axis acceleration detection signal AXO, the Y-axis acceleration detection signal AYO, the temperature detection signal TSO, and the test signal TST, based on a selection signal SEL from the control circuit 90. In this embodiment, an output signal MXO from the selection circuit 50 is a differential signal.

The analog/digital converter circuit 60 is supplied with the reference voltage VREFAD, converts the output signal MXO from the selection circuit 50 into a digital signal ADO, based on a control signal from the control circuit 90, and outputs the digital signal ADO. Specifically, the analog/digital converter circuit 60 converts the signal MXO, which is a differential signal, into the digital signal ADO, employing the voltage difference between the reference voltage VREFAD and the ground voltage VSS as the full-scale voltage. In this way, the full-scale voltage is set based on the reference voltage VREFAD. The full-scale voltage in this case is a voltage corresponding to the voltage range of a signal inputted to a successive approximation register (SAR) analog/digital converter 63 in the analog/digital converter circuit 60, described later with reference to FIG. 2, that is, the voltage range of each of output signals PO_P and PO_N from a programmable gain amplifier 62 in the analog/digital converter circuit 60.

As described above, the regulator circuit 130 generates the reference voltage VREFAD selected from among a plurality of voltages having different magnitudes, according to the power supply voltage VDD. Therefore, the full-scale voltage of the analog/digital converter circuit 60 changes according to the power supply voltage VDD. That is, the full-scale voltage of the analog/digital converter circuit 60 is selected from among a plurality of voltages having different magnitudes, according to the power supply voltage VDD. For example, when 5 V is selected as the power supply voltage VDD and the reference voltage VREFAD is 4.2 V, the full-scale voltage is 4.2 V. When 3.3 V is selected as the power supply voltage VDD and the reference voltage VREFAD is 2.7 V, the full-scale voltage is 2.7 V.

Since the full-scale voltage of the analog/digital converter circuit 60 is thus selected according to the power supply voltage VDD, a dynamic range as broad as possible can be secured in relation to the power supply voltage VDD. Therefore, even when an impact is applied to the physical quantity sensor 1, the voltage of the signal MXO inputted to the analog/digital converter circuit 60 is less likely to be saturated.

The digital signal processing circuit 70, the malfunction diagnosis circuit 80, the control circuit 90, the storage unit 100, and the interface circuit 110 form a logic circuit 200. The logic circuit 200 employs the reference voltage VLOGIC as the power supply voltage and operates with the clock signal MCK.

The digital signal processing circuit 70 processes the digital signal ADO outputted from the analog/digital converter circuit 60, based on a control signal from the control circuit 90. For example, the digital signal processing circuit 70 outputs a digital signal DSPO resulting from performing digital filter processing and correction processing on the digital signal ADO.

The malfunction diagnosis circuit 80 performs malfunction diagnosis on the analog/digital converter circuit 60 over a predetermined period, based on a control signal from the control circuit 90. Specifically, the malfunction diagnosis circuit 80 performs malfunction diagnosis on the analog/digital converter circuit 60, based on the digital signal ADO outputted from the analog/digital converter circuit 60, over a predetermined period. Based on the malfunction diagnosis, the malfunction diagnosis circuit 80 generates flag information representing whether the analog/digital converter circuit 60 has a malfunction or not, and stores the flag information into the storage unit 100.

The control circuit 90 generates and outputs various control signals for controlling the operations of the test signal generation circuit 40, the analog/digital converter circuit 60, the digital signal processing circuit 70, the malfunction diagnosis circuit 80 and the like, and the selection signal SEL.

The storage unit 100 has a non-volatile memory, not illustrated. In this non-volatile memory, various trimming data to the angular velocity signal processing circuit 10 and the acceleration signal processing circuit 20 or the like, and coefficient data used for processing by the digital signal processing circuit 70, and the like are stored. Also, power supply voltage selection information for selecting the power supply voltage VDD is stored in the non-volatile memory. The non-volatile memory may be configured, for example, as a MONOS (metal-oxide-nitride-oxide-silicon) memory or EEPROM (electrically erasable programmable read-only memory). The storage unit 100 also has a register, not illustrated. The storage unit 100 may be configured in such a way that various data stored in the non-volatile memory are transferred to and held in the register and the various data held in the register are supplied to the respective circuits, when the power of the physical quantity detection circuit 2 is turned on, that is, when the voltage at the VDD terminal rises from 0 V to a desired voltage. Also, in the register in the storage unit 100, the flag information generated by the malfunction diagnosis circuit 80 is stored.

The interface circuit 110 performs processing to output the digital signal DSPO outputted from the digital signal processing circuit 70, in response to a request from an external device. The interface circuit 110 also performs processing to read out and output data stored in the non-volatile memory or the register in the storage unit 100 in response to a request from an external device outside the physical quantity detection circuit 2, and processing to write data inputted from an external device into the non-volatile memory or the register in the storage unit 100, or the like. The interface circuit 110 may be, for example, an interface circuit of an SPI (serial peripheral interface) bus, or an interface circuit of an I²C (inter-integrated circuit) bus.

1-2. Configuration of Selection Circuit and Analog/Digital Converter Circuit

Figures 2, 3:
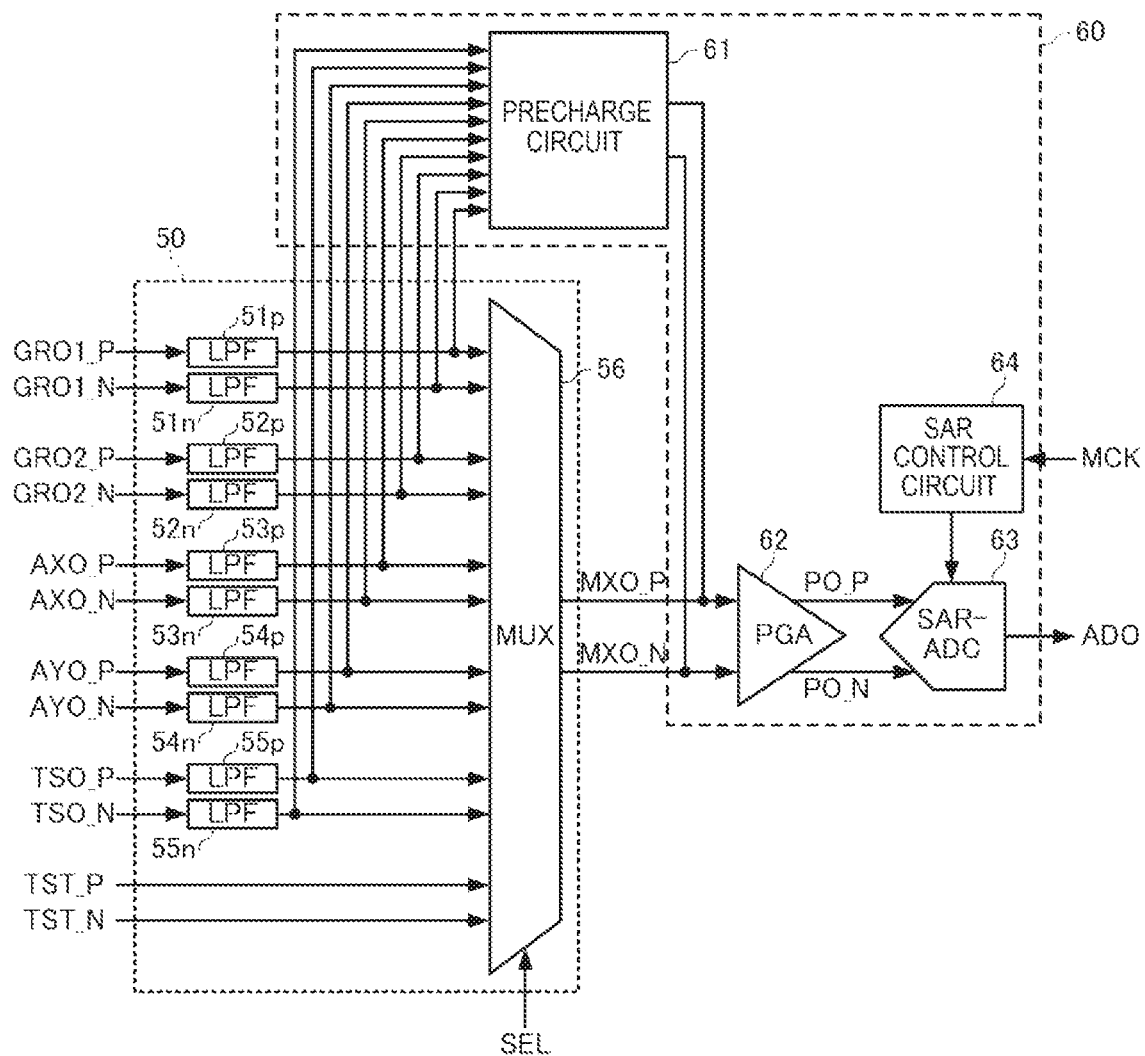
FIG. 2 shows a configuration example of a selection circuit and an analog/digital converter circuit.
FIG. 3 shows an example of a channel configuration in time-division processing by the analog/digital converter circuit.

FIG. 2 shows a configuration example of the selection circuit 50 and the analog/digital converter circuit 60. In the example in FIG. 2, the selection circuit 50 includes ten low-pass filters 51p, 51n, 52p, 52n, 53p, 53n, 54p, 54n, 55p, 55n, and a multiplexer 56.

Differential signals GRO1_P, GRO1_N forming the angular velocity detection signal GRO1 are low-pass filtered by the low-pass filters 51p, 51n, respectively, and then inputted to the multiplexer 56.

Differential signals GRO2_P, GRO2_N forming the vibration leakage signal GRO2 are low-pass-filtered by the low-pass filters 52p, 52n, respectively, and then inputted to the multiplexer 56.

Differential signals AXO_P, AXO_N forming the X-axis acceleration detection signal AXO are low-pass-filtered by the low-pass filters 53p, 53n, respectively, and then inputted to the multiplexer 56.

Differential signals AYO_P, AYO_N forming the Y-axis acceleration detection signal AYO are low-pass-filtered by the low-pass filters 54p, 54n, respectively, and then inputted to the multiplexer 56.

Differential signals TSO_P, TSO_N forming the temperature detection signal TSO are low-pass-filtered by the low-pass filters 55p, 55n, respectively, and then inputted to the multiplexer 56.

Differential signals TST_P, TST_N forming the test signal TST are inputted to the multiplexer 56 without being low-pass-filtered.

The multiplexer 56 selects one pair of differential signals from among the low-pass-filtered differential signals GRO1_P, GRO1_N, the low-pass-filtered differential signals GRO2_P, GRO2_N, the low-pass-filtered differential signals AXO_P, AXO_N, the low-pass-filtered differential signals AYO_P, AYO_N, the low-pass-filtered differential signals TSO_P, TSO_N, and the differential signals TST_P, TST_N, according to the selection signal SEL, and outputs the selected differential signals as differential signals MXO_P, MXO_N.

In the example in FIG. 2, the analog/digital converter circuit 60 includes a precharge circuit 61, the programmable gain amplifier 62, the successive approximation register (SAR) analog/digital converter 63, and a SAR control circuit 64.

The precharge circuit 61, in response to a control signal from the control circuit 90, charges an input node of the programmable gain amplifier 62 before conversion processing by the SAR analog/digital converter 63 is started. The precharge circuit 61 thus assists the charging with the differential signals MXO_P, MXO_N.

The programmable gain amplifier 62 outputs differential signals PO_P, PO_N amplified from the differential signals MXO_P, MXO_N. The gain of the programmable gain amplifier 62 is variably set according to the type of the differential signals selected as the differential signals MXO_P, MXO_N, in response to a control signal from the control circuit 90.

The SAR analog/digital converter 63, employing the voltage difference between VREFAD and VSS as the full-scale voltage, converts the voltage difference between the differential signals PO_P, PO_N into the digital signal ADO and outputs the digital signal ADO.

The SAR control circuit 64 operates with the clock signal MCK and performs processing such as selecting a voltage to be a reference for approximation, according to the timing of successive approximation by the SAR analog/digital converter 63 and the result of the approximation.

1-3. Channel Configuration in Time-Division Processing

As described above, the analog/digital converter circuit 60 converts the differential signal selected by the selection circuit 50 based on the selection signal SEL, into the digital signal ADO, and outputs the digital signal ADO. That is, the analog/digital converter circuit 60 processes the angular velocity detection signal GRO1, the vibration leakage signal GRO2, the X-axis acceleration detection signal AXO, the Y-axis acceleration detection signal AYO, the temperature detection signal TSO, and the test signal TST in time division, and converts each of these signals into a digital signal.

FIG. 3 shows an example of a channel configuration in time division processing by the analog/digital converter circuit 60.

As shown in FIG. 3, in a first channel, the selection signal SEL of 3 bits is "000" and the selection circuit 50 selects the angular velocity detection signal GRO1 as the input signal to the analog/digital converter circuit 60. Therefore, during the period of the first channel, the analog/digital converter circuit 60 converts the angular velocity detection signal GRO1, specifically the voltage difference between the differential signals GRO1_P, GRO1_N, into the digital signal ADO. In this way, in the first channel, processing on the angular velocity detection signal GRO1 is performed.

In a second channel following the first channel, the selection signal SEL of 3 bits is "001" and the selection circuit 50 selects the vibration leakage signal GRO2 as the input signal to the analog/digital converter circuit 60. Therefore, during the period of the second channel, the analog/digital converter circuit 60 converts the vibration leakage signal GRO2, specifically the voltage difference between the differential signals GRO2_P, GRO2_N, into the digital signal ADO. In this way, in the second channel, processing on the vibration leakage signal GRO2 is performed.

In a third channel following the second channel, the selection signal SEL of 3 bits is "010" and the selection circuit 50 selects the X-axis acceleration detection signal AXO as the input signal to the analog/digital converter circuit 60. Therefore, during the period of the third channel, the analog/digital converter circuit 60 converts the X-axis acceleration detection signal AXO, specifically the voltage difference between the differential signals AXO_P, AXO_N, into the digital signal ADO. In this way, in the third channel, processing on the X-axis acceleration detection signal AXO is performed.

In a fourth channel following the third channel, the selection signal SEL of 3 bits is "011" and the selection circuit 50 selects the Y-axis acceleration detection signal AYO as the input signal to the analog/digital converter circuit 60. Therefore, during the period of the fourth channel, the analog/digital converter circuit 60 converts the Y-axis acceleration detection signal AYO, specifically the voltage difference between the differential signals AYO_P, AYO_N, into the digital signal ADO. In this way, in the fourth channel, processing on the Y-axis acceleration detection signal AYO is performed.

In a fifth channel following the fourth channel, the selection signal SEL of 3 bits is "100" and the selection circuit 50 selects the temperature detection signal TSO as the input signal to the analog/digital converter circuit 60. Therefore, during the period of the fifth channel, the analog/digital converter circuit 60 converts the temperature detection signal TSO, specifically the voltage difference between the differential signals TSO_P, TSO_N, into the digital signal ADO. In this way, in the fifth channel, processing on the temperature detection signal TSO is performed.

In a sixth channel following the fifth channel, the test signal generation circuit 40 generates the test signal TST. The selection signal SEL of 3 bits is "101" and the test signal TST is selected as the input signal to the analog/digital converter circuit 60. Therefore, during the period of the sixth channel, the analog/digital converter circuit 60 converts the test signal TST, specifically the voltage difference between the differential signals TST_P, TST_N, into the digital signal ADO. In this way, in the sixth channel, digital conversion processing on the test signal TST is performed. The period of the sixth channel corresponds to a test period for malfunction diagnosis on the analog/digital converter circuit 60.

After the sixth channel, the first channel comes again. That is, a plurality of periods of the first to sixth channels are repeated in order. In the digital signal processing circuit 70, the order and coefficient value of the digital filter, the type and coefficient value of correction computation, and the like, are changed according to the processing target signal in the respective channels.

The digital signal ADO outputted from the analog/digital converter circuit 60 during one of the periods of the first channel, the third channel, and the fourth channel is equivalent to the "first digital signal". The digital signal ADO outputted from the analog/digital converter circuit 60 during the period of the sixth channel is equivalent to the "second digital signal".

1-4. Malfunction Diagnosis Processing

Figures 4, 5:
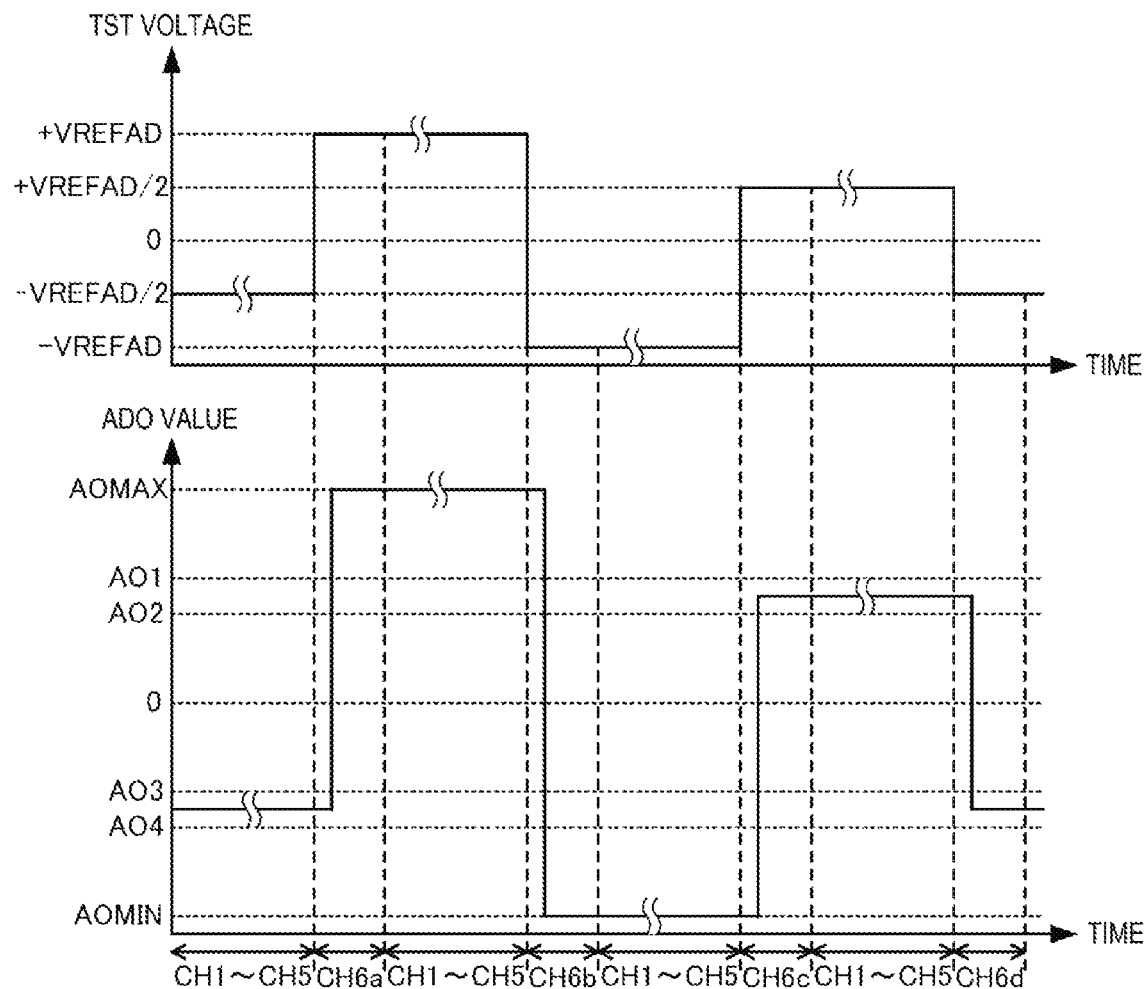
FIG. 4 shows a configuration example of a plurality of subchannels resulting from subdividing a sixth channel.
FIG. 5 shows an example of a test signal and a digital signal outputted from the analog/digital converter circuit.

A described above, the period of the sixth channel is the test period for diagnosing a malfunction of the analog/digital converter circuit 60. The sixth channel is subdivided into a plurality of subchannels for carrying out various tests, respectively. FIG. 4 shows a configuration example of the plurality of subchannels resulting from subdividing the sixth channel.

As shown in FIG. 4, tests for malfunction diagnosis on the analog/digital converter circuit 60 are carried out in subchannels 6a, 6b, 6c, 6d. FIG. 5 shows an example of the test signal TST and the digital signal ADO outputted from the analog/digital converter circuit 60 in the subchannels 6a, 6b, 6c, 6d. In FIG. 5, the horizontal axis represents time and the vertical axis represents the voltage of the test signal TST (voltage difference between the differential signals TST_P, TST_N) or the value of the digital signal ADO.

As shown in FIG. 5, in the subchannel 6a, the test signal generation circuit 40 sets the voltage value of the test signal TST, that is, the voltage difference between the differential signals TST_P, TST_N, to +VREFAD, and whether the value of the digital signal ADO outputted from the analog/digital converter circuit 60 is an upper limit value AOMAX or not, is tested. Specifically, as shown in FIG. 4, the differential signals TST_P, TST_N are set to the reference voltage VREFAD and the ground voltage VSS. When, for example, the analog/digital converter circuit 60 outputs the digital signal ADO of 14 bits, whether or not the value of the digital signal ADO is "01111111111111", that is, +8191 in the decimal system, is tested. In this way, the test signal TST in the subchannel 6a is an upper limit value test signal for turning the value of the output signal from the analog/digital converter circuit 60 into the upper limit value.

The malfunction diagnosis circuit 80 diagnoses that the analog/digital converter circuit 60 has a malfunction, when the value of the digital signal ADO converted from the upper limit value test signal by the analog/digital converter circuit 60 does not coincide with the upper limit value AOMAX at a predetermined timing in the period of the subchannel 6a, for example, immediately before the subchannel 6a ends.

As shown in FIG. 5, in the subchannel 6b, the test signal generation circuit 40 sets the voltage value of the test signal TST, that is, the voltage difference between the differential signals TST_P, TST_N, to −VREFAD, and whether the value of the digital signal ADO outputted from the analog/digital converter circuit 60 is a lower limit value AOMIN or not, is tested. Specifically, as shown in FIG. 4, the differential signals TST_P, TST_N are set to the ground voltage VSS and the reference voltage VREFAD. When, for example, the analog/digital converter circuit 60 outputs the digital signal ADO of 14 bits, whether or not the value of the digital signal ADO is "10000000000000", that is, −8192 in the decimal system, is tested. In this way, the test signal TST in the subchannel 6b is a lower limit value test signal for turning the value of the output signal from the analog/digital converter circuit 60 into the lower limit value.

The malfunction diagnosis circuit 80 diagnoses that the analog/digital converter circuit 60 has a malfunction, when the value of the digital signal ADO converted from the lower limit value test signal by the analog/digital converter circuit 60 does not coincide with the lower limit value AOMIN at a predetermined timing in the period of the subchannel 6b, for example, immediately before the subchannel 6b ends.

As shown in FIG. 5, in the subchannel 6c, the test signal generation circuit 40 sets the voltage value of the test signal TST, that is, the voltage difference between the differential signals TST_P, TST_N, to +VREFAD/2, and whether the value of the digital signal ADO outputted from the analog/digital converter circuit 60 is included in a first range AO1-AO2 between the upper limit value AOMAX and the lower limit value AOMIN or not, is tested. Specifically, as shown in FIG. 4, the differential signals TST_P, TST_N are set to the VREFAD×¾ and VREFAD×¼. When, for example, the analog/digital converter circuit 60 outputs the digital signal ADO of 14 bits, whether or not the value of the digital signal ADO is included in the first range AO1-AO2 including "00111111111111", that is, +4091 in the decimal system, is tested. In this way, the test signal TST in the subchannel 6c is a first intermediate value test signal for turning the value of the output signal from the analog/digital converter circuit 60 into a value between the upper limit value and the lower limit value.

The malfunction diagnosis circuit 80 diagnoses that the analog/digital converter circuit 60 has a malfunction, when the value of the digital signal ADO converted from the first intermediate value test signal by the analog/digital converter circuit 60 is not included in the first range AO1-AO2 at a predetermined timing in the period of the subchannel 6c, for example, immediately before the subchannel 6c ends.

As shown in FIG. 5, in the subchannel 6d, the test signal generation circuit 40 sets the voltage value of the test signal TST, that is, the voltage difference between the differential signals TST_P, TST_N, to −VREFAD/2, and whether the value of the digital signal ADO outputted from the analog/digital converter circuit 60 is included in a second range AO3-AO4 between the upper limit value AOMAX and the lower limit value AOMIN or not, is tested. Specifically, as shown in FIG. 4, the differential signals TST_P, TST_N are set to the VREFAD×¼ and VREFAD×¾. When, for example, the analog/digital converter circuit 60 outputs the digital signal ADO of 14 bits, whether or not the value of the digital signal ADO is included in the second range AO3-AO4 including "01000000000000", that is, −4092 in the decimal system, is tested. In this way, the test signal TST in the subchannel 6d is a second intermediate value test signal for turning the value of the output signal from the analog/digital converter circuit 60 into a value between the upper limit value and the lower limit value.

The malfunction diagnosis circuit 80 diagnoses that the analog/digital converter circuit 60 has a malfunction, when the value of the digital signal ADO converted from the second intermediate value test signal by the analog/digital converter circuit 60 is not included in the second range AO3-AO4 at a predetermined timing in the period of the subchannel 6d, for example, immediately before the subchannel 6d ends.

As shown in FIGS. 4 and 5, the voltage value of the first intermediate value test signal and the voltage value of the second intermediate value test signal are different from each other.

1-5. Configuration of Test Signal Generation Circuit

As described above, the full-scale voltage of the analog/digital converter circuit 60 is selected from among a plurality of voltages having different magnitudes, according to the power supply voltage VDD. Therefore, if the test signal generation circuit 40 generates the test signal TST having a constant voltage value regardless of the full-scale voltage, as the first intermediate value test signal or the second intermediate value test signal, the value of the digital signal ADO converted from the test signal TST by the analog/digital converter circuit 60 changes according to the full-scale voltage. Consequently, the first range AO1-AO2 and the second range AO3-AO4 used for malfunction diagnosis on the analog/digital converter circuit 60 need to be changed according to the full-scale voltage and this increases the scale of the malfunction diagnosis circuit 80. Therefore, the test signal generation circuit 40 needs to generate the test signal TST having a voltage value that changes according to the full-scale voltage, as the first intermediate value test signal or the second intermediate value test signal in order to keep the first range AO1-AO2 and the second range AO3-AO4 constantly regardless of the full-scale voltage. However, if the test signal generation circuit 40 generates the test signal TST as the first intermediate value test signal or the second intermediate value test signal via different circuits corresponding to different full-scale voltages, the scale of the test signal generation circuit 40 increases. Thus, in this embodiment, the test signal generation circuit 40 performs resistive voltage division of the full-scale voltage to generate the test signal TST as the first intermediate value test signal or the second intermediate value test signal.

Figure 6:
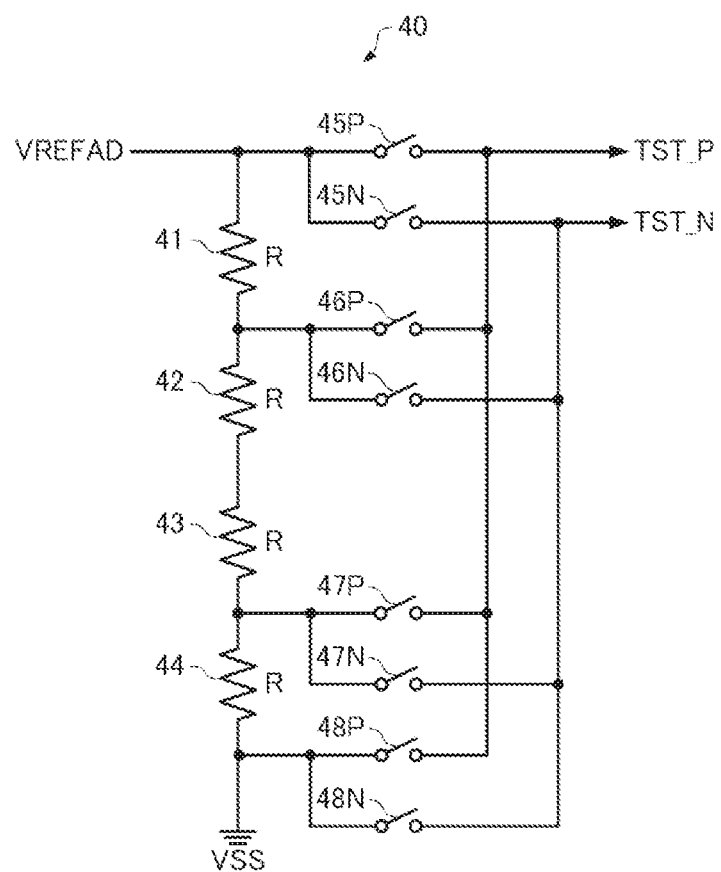
FIG. 6 shows a configuration example of a test signal generation circuit.

FIG. 6 shows a configuration example of the test signal generation circuit 40. As shown in FIG. 6, the test signal generation circuit 40 includes four resistors 41, 42, 43, 44, and eight switches 45P, 45N, 46P, 46N, 47P, 47N, 48P, 48N.

The resistor 41 is supplied with the reference voltage VREFAD at its one end and has its other end coupled to one end of the resistor 42. The resistor 42 has its one end coupled to the other end of the resistor 41 and has its other end coupled to one end of the resistor 43. The resistor 43 has its one end coupled to the other end of the resistor 42 and has its other end coupled to one end of the resistor 44. The resistor 44 has its one end coupled to the other end of the resistor 43 and is supplied with the ground voltage VSS at its other end. The resistors 41, 42, 43, 44 have the same resistance value R.

One end of the switch 45P and one end of the switch 45N are coupled to the one end of the resistor 41. One end of the switch 46P and one end of the switch 46N are coupled to the other end of the resistor 41 and the one end of the resistor 42. One end of the switch 47P and one end of the switch 47N are coupled to the other end of the resistor 43 and the one end of the resistor 44. One end of the switch 48P and one end of the switch 48N are coupled to the other end of the resistor 44. The other end of the switch 45P, the other end of the switch 46P, the other end of the switch 47P, and the other end of the switch 48P are coupled to each other. The signal TST_P is outputted from the coupling point of these switches. The other end of the switch 45N, the other end of the switch 46N, the other end of the switch 47N, and the other end of the switch 48N are coupled to each other. The signal TST_N is outputted from the coupling point of these switches.

The four switches 45P, 46P, 47P, 48P are controlled by the control circuit 90 in such a way that one of these switches has electrical continuity while the other three have no electrical continuity. Similarly, the four switches 45N, 46N, 47N, 48N are controlled by the control circuit 90 in such a way that one of these switches has electrical continuity while the other three have no electrical continuity.

For example, in the subchannel 6a, the switches are controlled in such a way that only the switch 45P and the switch 48N have electrical continuity. Thus, the voltage of the signal TST_P is VREFAD and the voltage of the signal TST_N is VSS. Therefore, the voltage difference between the difference signals TST_P, TST_N is set to +VREFAD. Consequently, the test signal TST having the voltage value of +VREFAD is generated as the upper limit value test signal.

In the subchannel 6b, the switches are controlled in such a way that only the switch 48P and the switch 45N have electrical continuity. Thus, the voltage of the signal TST_P is VSS and the voltage of the signal TST_N is VREFAD. Therefore, the voltage difference between the difference signals TST_P, TST_N is set to −VREFAD. Consequently, the test signal TST having the voltage value of −VREFAD is generated as the lower limit value test signal.

In the subchannel 6c, the switches are controlled in such a way that only the switch 46P and the switch 47N have electrical continuity. Thus, the voltage of the signal TST_P is VREFAD×¾ and the voltage of the signal TST_N is VREFAD×¼. Therefore, the voltage difference between the difference signals TST_P, TST_N is set to +VREFAD×½. Consequently, the test signal TST formed of the signal TST_P resulting from resistive voltage division of the full-scale voltage to ¾ and the signal TST_N resulting from resistive voltage division of the full-scale voltage to ¼ is generated as the first intermediate value test signal.

In the subchannel 6d, the switches are controlled in such a way that only the switch 47P and the switch 46N have electrical continuity. Thus, the voltage of the signal TST_P is VREFAD×¼ and the voltage of the signal TST_N is VREFAD×¾. Therefore, the voltage difference between the difference signals TST_P, TST_N is set to −VREFAD×½. Consequently, the test signal TST formed of the signal TST_P resulting from resistive voltage division of the full-scale voltage to ¼ and the signal TST_N resulting from resistive voltage division of the full-scale voltage to ¾ is generated as the second intermediate value test signal.

In this way, the test signal TST as the upper limit value test signal constantly has +VREFAD, which is the upper limit voltage of the analog/digital converter circuit 60. Therefore, the expected value of the digital signal ADO converted from the test signal TST by the analog/digital converter circuit 60 is the upper limit value AOMAX. Similarly, the test signal TST as the lower limit value test signal constantly has −VREFAD, which is the lower limit voltage of the analog/digital converter circuit 60. Therefore, the expected value of the digital signal ADO converted from the test signal TST by the analog/digital converter circuit 60 is the lower limit value AOMIN.

The test signal TST as the first intermediate value test signal changes with the full-scale voltage. The first range AO1-AO2 can be kept constant regardless of the magnitude of the full-scale voltage. Similarly, the test signal TST as the second intermediate value test signal changes with the full-scale voltage. The second range AO3-AO4 can be kept constant regardless of the magnitude of the full-scale voltage.

Thus, the malfunction diagnosis circuit 80 can keep a constant reference for malfunction diagnosis on the upper limit value test signal, the lower limit value test signal, the first intermediate value test signal, and the second intermediate value test signal, regardless of the full-scale voltage. Therefore, the circuit scale of the malfunction diagnosis circuit 80 can be reduced.

The test signal generation circuit 40 generates the upper limit value test signal, the lower limit value test signal, the first intermediate value test signal, and the second intermediate value test signal via a circuit common to different full-scale voltages. Therefore, the circuit scale of the test signal generation circuit 40 can be reduced.

1-6. Procedures in Method for Malfunction Diagnosis

Figure 7:
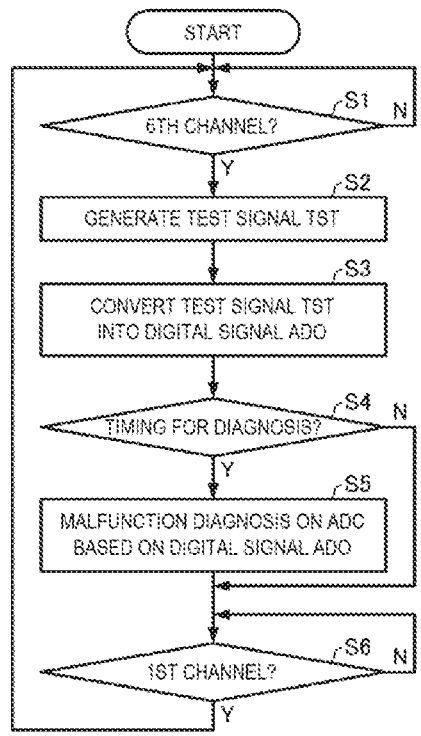
FIG. 7 is a flowchart showing an example of procedures in a method for malfunction diagnosis according to an embodiment.

FIG. 7 is a flowchart showing an example of procedures in a method for malfunction diagnosis on the physical quantity sensor 1 according to this embodiment. In the flowchart of FIG. 7, the processing in each step may be changed in order according to need.

As shown in FIG. 7, as the timing for the sixth channel comes (Y in step S1), the test signal generation circuit 40 generates the test signal TST (step S2). Specifically, the test signal generation circuit 40 generates the foregoing test signal TST for each of the subchannels 6a, 6b, 6c, 6d.

Next, the analog/digital converter circuit 60 converts the test signal TST into the digital signal ADO (step S3).

Next, as the timing for diagnosis comes (Y in step S4), the malfunction diagnosis circuit 80 performs malfunction diagnosis on the analog/digital converter circuit 60, based on the digital signal ADO (step S5). Specifically, the malfunction diagnosis circuit 80 performs the foregoing malfunction diagnosis on each of the subchannels 6a, 6b, 6c, 6d. If the timing for diagnosis does not come (N in step S4), the malfunction diagnosis circuit 80 does not perform the processing in step S5.

After the timing for the first channel comes (Y in step S6), the processing in steps S2 to S5 is executed every time the timing for the sixth channel comes (Y in step S1).

Step S2 in FIG. 7 is an example of the "test signal generation step". Step S3 in FIG. 7 is an example of the "analog/digital conversion step". Step S5 in FIG. 7 is an example of the "malfunction diagnosis step".

1-7. Advantageous Effects

In this embodiment, the test signal TST includes the upper limit value test signal for turning the value of the output signal from the analog/digital converter circuit 60 into the upper limit value AOMAX, and the lower limit value test signal for turning the value of the output signal from the analog/digital converter circuit 60 into the lower limit value AOMIN. The malfunction diagnosis circuit 80 diagnoses that the analog/digital converter circuit 60 has a malfunction, when the value of the digital signal ADO converted from the upper limit value test signal by the analog/digital converter circuit 60 does not coincide with the upper limit value AOMAX. The malfunction diagnosis circuit 80 diagnoses that the analog/digital converter circuit 60 has a malfunction, when the value of the digital signal ADO converted from the lower limit value test signal by the analog/digital converter circuit 60 does not coincide with the lower limit value AOMIN. Therefore, according to this embodiment, a malfunction that causes an abnormality in the range of the output value from the analog/digital converter circuit 60 can be diagnosed. Also, in this embodiment, for example, as in the foregoing example, when the upper limit value AOMAX of the value of the digital signal ADO is "01111111111111" and the lower limit value AOMIN is "10000000000000", whether each bit of the digital signal ADO is inverted or not is tested. Therefore, a malfunction that causes each bit to be fixed to "0" or "1" can be diagnosed.

In this embodiment, the test signal TST also includes the first intermediate value test signal for turning the value of the output signal from the analog/digital converter circuit 60 into a value between the upper limit value AOMAX and the lower limit value AOMIN. The malfunction diagnosis circuit 80 diagnoses that the analog/digital converter circuit 60 has a malfunction, when the value of the digital signal ADO converted from the first intermediate value test signal by the analog/digital converter circuit 60 is not included in the first range AO1-AO2. Therefore, according to this embodiment, a malfunction that causes an abnormality in the value between the upper limit value and the lower limit value of the output signal from the analog/digital converter circuit 60 can be diagnosed.

In this embodiment, the test signal TST further includes the second intermediate value test signal for turning the value of the output signal from the analog/digital converter circuit 60 into a value between the upper limit value AOMAX and the lower limit value AOMIN. The voltage value of the first intermediate value test signal and the voltage value of the second intermediate value test signal are different from each other. The malfunction diagnosis circuit 80 diagnoses that the analog/digital converter circuit 60 has a malfunction, when the value of the digital signal ADO converted from the second intermediate value test signal by the analog/digital converter circuit 60 is not included in the second range AO3-AO4. Therefore, according to this embodiment, a malfunction that causes an abnormality in the value between the upper limit value and the lower limit value of the output signal from the analog/digital converter circuit 60 can be diagnosed more accurately.

In this way, according to this embodiment, a malfunction of the analog/digital converter circuit 60 can be accurately diagnosed. Therefore, the reliability of malfunction diagnosis on the physical quantity detection circuit 2 and the physical quantity sensor 1 can be increased.

In this embodiment, during the periods of the first to fifth channels, of the periods of the first to sixth channels repeated in order, the analog/digital converter circuit 60 converts the angular velocity detection signal GRO1, the vibration leakage signal GRO2, the X-axis acceleration detection signal AXO, the Y-axis acceleration detection signal AYO, and the temperature detection signal TSO into the digital signal ADO, and the digital signal processing circuit 70 processes the digital signal ADO and thus generates the digital signal DSPO. Meanwhile, during the period of the sixth channel, the analog/digital converter circuit 60 converts the test signal TST into the digital signal ADO, and the malfunction diagnosis circuit performs malfunction diagnosis on the analog/digital converter circuit 60, based on the digital signal ADO. That is, in this embodiment, the malfunction diagnosis circuit performs malfunction diagnosis on the analog/digital converter circuit 60 between the periods when the analog/digital converter circuit 60 and the digital signal processing circuit 70 perform normal processing. Thus, according to this embodiment, since malfunction diagnosis on the analog/digital converter circuit 60 can be performed constantly, the physical quantity detection circuit 2 and the physical quantity sensor 1 with higher reliability can be realized.

In this embodiment, the full-scale voltage of the analog/digital converter circuit 60 is selected from among a plurality of voltages having different magnitudes, according to the power supply voltage VDD. Specifically, the regulator circuit 130 generates a voltage selected from among a plurality of voltages having different magnitudes, according to the power supply voltage VDD, and outputs the generated voltage as the reference voltage VREFAD of the analog/digital converter circuit 60. The full-scale voltage is set based on the reference voltage VREFAD. Since the full-scale voltage of the analog/digital converter circuit 60 is thus selected according to the power supply voltage VDD, a dynamic range as broad as possible can be secured in relation to the power supply voltage VDD. Therefore, even when an impact is applied to the physical quantity sensor 1, the voltage inputted to the analog/digital converter circuit 60 is less likely to be saturated. Thus, the digital signal DSPO outputted from the physical quantity sensor 1 is less likely to have a large error. This reduces the risk of an incorrect operation in the external device processing the digital signal DSPO.

In this embodiment, the test signal generation circuit 40 performs resistive voltage division of the full-scale voltage and thus generates the first intermediate value test signal and the second intermediate value test signal. Since the test signal generation circuit 40 can generate the first intermediate value test signal and the second intermediate value test signal via a circuit common to different full-scale voltages, the circuit scale of the test signal generation circuit 40 can be reduced. Also, since the first range AO1-AO2 and the second range AO3-AO4, which are references for malfunction diagnosis with respect to the first intermediate value test signal and the second intermediate value test signal, are constant regardless of the magnitude of the full-scale voltage, the circuit scale of the malfunction diagnosis circuit 80 can be reduced. Thus, according to this embodiment, the physical quantity detection circuit 2 and the physical quantity sensor 1 having higher reliability in malfunction diagnosis without increasing the circuit scale can be realized.

1-8. Modification Examples

In the foregoing embodiment, for example, the two intermediate value test signals, that is, the first intermediate value test signal and the second intermediate value test signal, are used as the test signal TST for turning the value of the output signal from the analog/digital converter circuit 60 into a value between the upper limit value and the lower limit value. However, one, or three or more intermediate value test signals may be used. For example, increasing the number of resistors coupled in series and the number of switches coupled to the resistors for voltage division of the reference voltage VREFAD in the configuration of the test signal generation circuit 40 shown in FIG. 6 can provide three or more intermediate value test signals. Increasing the number of intermediate value test signals improves the reliability of malfunction diagnosis.

Also, in the embodiment, for example, the values in the first range AO1-AO2 and the second range AO3-AO4 or the like may be variably set in the storage unit 100.

In the embodiment, the analog/digital converter circuit 60 takes in a differential signal and converts the differential signal into the digital signal ADO. However, the analog/digital converter circuit 60 may take in a single-ended signal and convert the single-ended signal into the digital signal ADO.

In the embodiment, the physical quantity sensor 1 includes the angular velocity detection element 3, the acceleration detection element 4X, and the acceleration detection element 4Y. However, a sensor having only a part of these physical quantity detection elements may be employed. Also, the physical quantity sensor 1 may include a physical quantity detection element detecting a physical quantity other than angular velocity and acceleration, for example, a physical quantity such as angular acceleration, velocity, force or the like.

In the embodiment, an example in which the vibrator element of the angular velocity detection element 3 is a double-T quartz crystal vibrator element is described. However, the vibrator element of the physical quantity detection element detecting various physical quantities may be, for example, a tuning fork type or interdigital type, or may be a tuning bar having the shape of a triangular prism, quadrangular prism, cylinder, or the like. As the material of the vibrator element of the physical quantity detection element, for example, a piezoelectric material such as a piezoelectric single crystal like lithium tantalate ($LiTaO_3$) or lithium niobate ($LiNbO_3$) or a piezoelectric ceramic like lead zirconate titanate (PZT), or a silicon semiconductor may be used, instead of quartz crystal ($SiO_2$). The vibrator element of the physical quantity detection element may have, for example, a structure in which a piezoelectric thin film of zinc oxide (ZnO), aluminum nitride (AlN) or the like held between drive electrodes is arranged at a part of the surface of a silicon semiconductor.

In the embodiment, the piezoelectric-type angular velocity detection element 3 and the electrostatic capacitance-type acceleration detection elements 4X, 4Y are described as an example. However, the physical quantity detection element detecting various physical quantities is not limited to a piezoelectric-type or electrostatic capacitance-type element and may be an electrokinetic, eddy-current, optical, or strain gauge-type element or the like. The detection method by the physical quantity detection element is not limited to vibration and may be, for example, optical, rotary, fluid-based.

2. Electronic Apparatus

Figure 8:
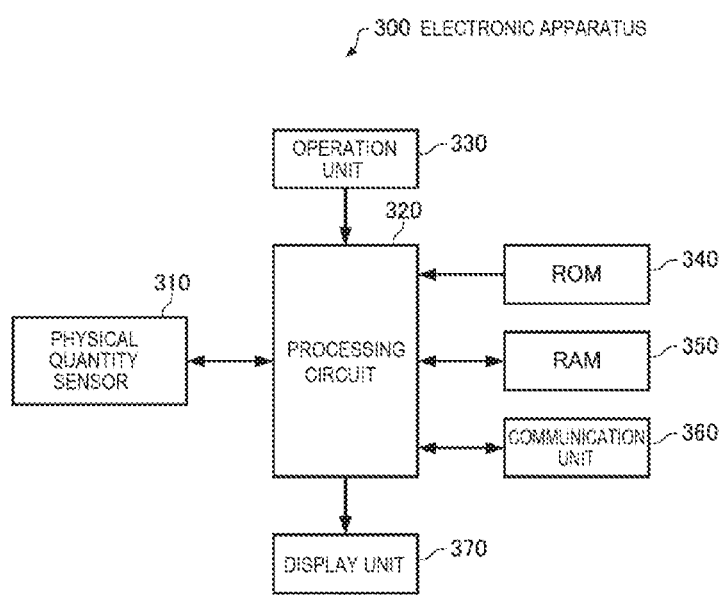
FIG. 8 is a functional block diagram showing an example of the configuration of an electronic apparatus according to an embodiment.

FIG. 8 is a functional block diagram showing an example of the configuration of an electronic apparatus according to an embodiment. As shown in FIG. 8, an electronic apparatus 300 according to this embodiment includes a physical quantity sensor 310, a processing circuit 320, an operation unit 330, a ROM (read-only memory) 340, a RAM (random-access memory) 350, a communication unit 360, and a display unit 370. Also, in the electronic apparatus according to this embodiment, a part of the components shown in FIG. 8 may be omitted or changed, or another component may be added to the configuration in FIG. 8.

The physical quantity sensor 310 detects a physical quantity and outputs the result of the detection to the processing circuit 320. As the physical quantity sensor 310, for example, the physical quantity sensor 1 according to the foregoing embodiment can be employed.

The processing circuit 320 performs processing based on the output signal from the physical quantity sensor 310. Specifically, based on a program stored in the ROM 340 or the like, the processing circuit 320 communicates with the physical quantity sensor 310 and performs various kinds of calculation processing and control processing using the output signal from the physical quantity sensor 310. Also, the processing circuit 320 performs various kinds of processing corresponding to an operation signal from the operation unit 330, processing of controlling the communication unit 360 in order to communicate data with an external device, processing of transmitting a display signal to cause the display unit 370 to display various kinds of information, and the like.

The operation unit 330 is an input device formed of an operation key, button switch or the like. The operation unit 330 outputs an operation signal corresponding to an operation by a user, to the processing circuit 320.

The ROM 340 stores a program, data or the like for the processing circuit 320 to perform various kinds of calculation processing and control processing.

The RAM 350 is used as a work area for the processing circuit 320 and temporarily stores a program and data read out from the ROM 340, data inputted from the operation unit 330, results of computations executed by the processing circuit 320 according to various programs, and the like.

The communication unit 360 performs various kinds of control to establish data communication between the processing circuit 320 and an external device.

The display unit 370 is a display device formed of an LCD (liquid crystal display) or the like and displays various kinds of information, based on a display signal inputted from the processing circuit 320. The display unit 370 may be provided with a touch panel functioning as the operation unit 330.

Applying, for example, the physical quantity sensor 1 according to the foregoing embodiment as the physical quantity sensor 310 can realize, for example, a highly reliable electronic apparatus.

As the electronic apparatus 300, various electronic apparatuses may be employed, for example, a mobile, laptop or tablet personal computer, mobile terminal such as smartphone or mobile phone, digital camera, inkjet ejection device such as inkjet printer, storage area network device such as router or switch, local area network device, mobile terminal base station device, television, video camera, video tape recorder, car navigation device, real-time clock device, pager, electronic organizer, electronic dictionary, electronic calculator, electronic game device, game controller, word processor, workstation, videophone, security monitor, electronic binoculars, POS terminal, medical equipment such as electronic body thermometer, blood pressure monitor, blood sugar monitor, electrocardiograph, ultrasonic diagnostic device or electronic endoscope, fishfinder, various measuring devices, instruments on a vehicle, aircraft or ship, flight simulator, head-mounted display, motion tracing, motion tracking, motion controller, and pedestrian dead reckoning (PDR) device, or the like.

Figure 9:
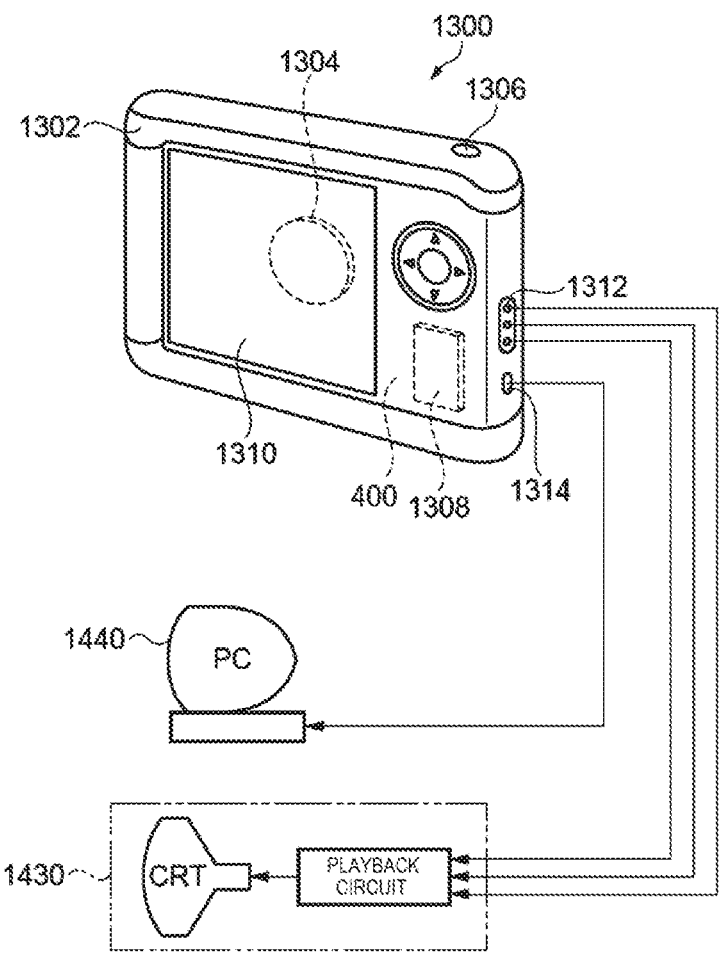
FIG. 9 is a perspective view schematically showing a digital camera as an example of the electronic apparatus.

FIG. 9 is a perspective view schematically showing a digital camera 1300, which is an example of the electronic apparatus 300 according to this embodiment. FIG. 9 also schematically shows the coupling with an external device. While an ordinary camera exposes a silver-halide photo film to light via an optical image of a subject, the digital camera 1300 photoelectrically converts an optical image of a subject via an image pickup element such as a CCD (charge-coupled device) to generate a picked-up image signal.

A display unit 1310 is provided at the back side of a case 1302 of the digital camera 1300 and is configured to show a display based on the picked-up image signal from the CCD. The display unit 1310 functions as a viewfinder displaying a subject as an electronic image. A light receiving unit 1304 including an optical lens, CCD and the like is provided at the front side of the case 1302. As a photographer checks a subject image displayed at the display unit 1310 and presses a shutter button 1306, the picked-up image signal from the CCD at that time point is transferred to and stored in a memory 1308. Also, in this digital camera 1300, a video signal output terminal 1312 and an input/output terminal 1314 for data communication are provided at a lateral side of the case 1302. A television monitor 1430 is coupled to the video signal output terminal 1312 and a personal computer 1440 is coupled to the input/output terminal 1314 for data communication according to need. Also, the picked-up image signal stored in the memory 1308 is outputted to the television monitor 1430 and the personal computer 1440 in response to a predetermined operation. The digital camera 1300 has, for example, the physical quantity sensor 310 that is an angular velocity sensor, and performs processing such as image stabilization using an output signal from the physical quantity sensor 310.

3. Vehicle

Figure 10:
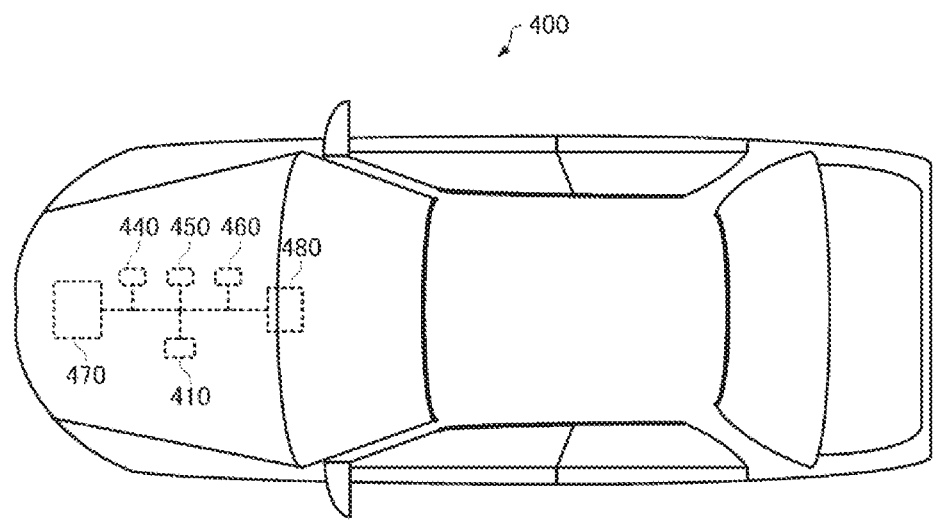
FIG. 10 shows an example of a vehicle according to an embodiment.

FIG. 10 shows an example of a vehicle according to an embodiment. A vehicle 400 shown in FIG. 10 includes a physical quantity sensor 410, processing circuits 440, 450, 460, a battery 470, and a navigation device 480. As the vehicle according to this embodiment, a part of the components shown in FIG. 10 may be omitted or changed, or another component may be added to the configuration in FIG. 10.

The physical quantity sensor 410, the processing circuits 440, 450, 460, and the navigation device 480 operate with a power supply voltage supplied from the battery 470.

The physical quantity sensor 410 detects a physical quantity and outputs the result of the detection to the processing circuits 440, 450, 460.

The processing circuits 440, 450, 460 perform processing based on the output signal from the physical quantity sensor 410. For example, the processing circuits 440, 450, 460 perform various kinds of control on an attitude control system, a roll-over prevention system, a brake system or the like, using the output signal from the physical quantity sensor 410.

The navigation device 480 displays the location of the vehicle 400, time, and various other kinds of information at a display, based on output information from a built-in GPS receiver. Even when GPS radio waves do not reach the vehicle 400, the navigation device 480 specifies the location and direction of the vehicle 400, based on the output signal from the physical quantity sensor 410, and continues displaying necessary information.

Applying, for example, the physical quantity sensor 1 according to the foregoing embodiment as the physical quantity sensor 410 can realize, for example, a highly reliable vehicle.

As the vehicle 400, various vehicles may be employed, for example, an automobile such as electric vehicle, aircraft such as jet plane or helicopter, ship, rocket, and artificial satellite or the like.

The embodiments and modification examples are simply examples and not limiting. For example, the respective embodiments and modification examples can be combined together according to need.

The present disclosure includes a configuration substantially the same as any of the configurations described in the embodiments (for example, a configuration having the same function, method, and result, or a configuration having the same object and effect). The present disclosure also includes a configuration resulting from replacing a non-essential part of any of the configurations described in the embodiments. The present disclosure also includes a configuration achieving the same advantageous effect or the same object as any of the configurations described in the embodiments. The present disclosure also includes a configuration resulting from adding a known technique to any of the configurations described in the embodiments.

What is claimed is:

1. A physical quantity detection circuit comprising:
a detection signal generation circuit generating a detection signal corresponding to a physical quantity, based on an output signal from a physical quantity detection element detecting the physical quantity;
an analog/digital converter circuit converting the detection signal into a first digital signal and converting a test signal into a second digital signal;
a test signal generation circuit generating the test signal; and
a malfunction diagnosis circuit diagnosing a malfunction of the analog/digital converter circuit, based on the second digital signal, wherein
a full-scale voltage of the analog/digital converter circuit is selected from among a plurality of voltages having different magnitudes, according to a power supply voltage,
the test signal includes
an upper limit value test signal for turning a value of an output signal from the analog/digital converter circuit into an upper limit value,
a lower limit value test signal for turning the value of the output signal from the analog/digital converter circuit into a lower limit value, and
a first intermediate value test signal for turning the value of the output signal from the analog/digital converter circuit into a value between the upper limit value and the lower limit value, and
the test signal generation circuit performs resistive voltage division of the full-scale voltage and thus generates the first intermediate value test signal.

2. The physical quantity detection circuit according to claim 1, wherein
the malfunction diagnosis circuit
diagnoses that the analog/digital converter circuit has a malfunction, when the value of the second digital signal converted from the upper limit value test signal by the analog/digital converter circuit does not coincide with the upper limit value,
diagnoses that the analog/digital converter circuit has a malfunction, when the value of the second digital signal converted from the lower limit value test signal by the analog/digital converter circuit does not coincide with the lower limit value, and
diagnoses that the analog/digital converter circuit has a malfunction, when the value of the second digital value converted from the first intermediate value test signal by the analog/digital converter circuit is not included in a first range between the upper limit value and the lower limit value.

3. The physical quantity detection circuit according to claim 2, wherein
the first range is constant regardless of a magnitude of the full-scale voltage.

4. The physical quantity detection circuit according to claim 1, wherein
the test signal further includes a second intermediate value test signal for turning the value of the output signal from the analog/digital converter circuit into a value between the upper limit value and the lower limit value,
a voltage value of the first intermediate value test signal and a voltage value of the second intermediate value test signal are different from each other, and
the test signal generation circuit performs resistive voltage division of the full-scale voltage and thus generates the second intermediate value test signal.

5. The physical quantity detection circuit according to claim 4, wherein
the malfunction diagnosis circuit diagnoses that the analog/digital converter circuit has a malfunction, when the value of the second digital signal converted from the second intermediate value test signal by the analog/digital converter circuit is not included in a second range between the upper limit value and the lower limit value.

6. The physical quantity detection circuit according to claim 5, wherein
the second range is constant regardless of a magnitude of the full-scale voltage.

7. The physical quantity detection circuit according to claim 1, further comprising
a regulator circuit generating a voltage selected from among a plurality of voltages having different magnitudes from each other, according to the power supply voltage, and outputting the generated voltage as a reference voltage of the analog/digital converter circuit, wherein
the full-scale voltage is set based on the reference voltage.

8. A physical quantity sensor comprising:
a physical quantity detection circuit including:
a detection signal generation circuit generating a detection signal corresponding to a physical quantity, based on an output signal from a physical quantity detection element detecting the physical quantity;
an analog/digital converter circuit converting the detection signal into a first digital signal and converting a test signal into a second digital signal;
a test signal generation circuit generating the test signal; and
a malfunction diagnosis circuit diagnosing a malfunction of the analog/digital converter circuit, based on the second digital signal, wherein
a full-scale voltage of the analog/digital converter circuit is selected from among a plurality of voltages having different magnitudes, according to a power supply voltage,
the test signal includes
an upper limit value test signal for turning a value of an output signal from the analog/digital converter circuit into an upper limit value,
a lower limit value test signal for turning the value of the output signal from the analog/digital converter circuit into a lower limit value, and
a first intermediate value test signal for turning the value of the output signal from the analog/digital converter circuit into a value between the upper limit value and the lower limit value, and
the test signal generation circuit performs resistive voltage division of the full-scale voltage and thus generates the first intermediate value test signal; and the physical quantity detection element.

9. A method for malfunction diagnosis on a physical quantity sensor, for diagnosing a malfunction of a physical quantity sensor including a physical quantity detection element detecting a physical quantity, a detection signal generation circuit generating a detection signal corresponding to the physical quantity, based on an output signal from the physical quantity detection element, and an analog/digital converter circuit converting the detection signal into a first digital signal, in which a full-scale voltage of the analog/digital converter circuit is selected from among a plurality of voltages having different magnitudes from each other, according to a power supply voltage, the method comprising:
- a test signal generation step of generating a test signal;
- an analog/digital conversion step of converting the test signal into a second digital signal having the voltage selected according to the power supply voltage, as the full-scale voltage, by the analog/digital converter circuit; and
- a malfunction diagnosis step of diagnosing a malfunction of the analog/digital converter circuit, based on the second digital signal, wherein
- the test signal includes
  - an upper limit value test signal for turning a value of an output signal from the analog/digital converter circuit into an upper limit value,
  - a lower limit value test signal for turning the value of the output signal from the analog/digital converter circuit into a lower limit value, and
  - a first intermediate value test signal for turning the value of the output signal from the analog/digital converter circuit into a value between the upper limit value and the lower limit value, and
- in the test signal generation step, resistive voltage division of the full-scale voltage is performed to generate the first intermediate value test signal.

10. The method for malfunction diagnosis on the physical quantity sensor according to claim 9,
- in the malfunction diagnosis step,
- it is diagnosed that the analog/digital converter circuit has a malfunction, when the value of the second digital signal converted from the upper limit value test signal by the analog/digital converter circuit does not coincide with the upper limit value,
- it is diagnosed that the analog/digital converter circuit has a malfunction, when the value of the second digital signal converted from the lower limit value test signal by the analog/digital converter circuit does not coincide with the lower limit value, and
- it is diagnosed that the analog/digital converter circuit has a malfunction, when the value of the second digital signal converted from the first intermediate value test signal by the analog/digital converter circuit is not included in a first range between the upper limit value and the lower limit value.

11. The method for malfunction diagnosis on the physical quantity sensor according to claim 10, wherein
- the first range is constant regardless of a magnitude of the full-scale voltage.

12. The method for malfunction diagnosis on the physical quantity sensor according to claim 9, wherein
- the test signal further includes a second intermediate value test signal for turning the value of the output signal from the analog/digital converter circuit into a value between the upper limit value and the lower limit value,
- a voltage value of the first intermediate value test signal and a voltage value of the second intermediate value test signal are different from each other, and
- in the test signal generation step, resistive voltage division of the full-scale voltage is performed to generate the second intermediate value test signal.

13. The method for malfunction diagnosis on the physical quantity sensor according to claim 12, wherein
- in the malfunction diagnosis step, it is diagnosed that the analog/digital converter circuit has a malfunction, when the value of the second digital signal converted from the second intermediate value test signal by the analog/digital converter circuit is not included in a second range between the upper limit value and the lower limit value.

14. The method for malfunction diagnosis on the physical quantity sensor according to claim 13, wherein
- the second range is constant regardless of a magnitude of the full-scale voltage.

15. The method for malfunction diagnosis on the physical quantity sensor according to claim 9, wherein
- the physical quantity sensor includes a regulator circuit generating a voltage selected from among a plurality of voltages having different magnitudes from each other, according to the power supply voltage, and outputting the generated voltage as a reference voltage of the analog/digital converter circuit, and
- the full-scale voltage is set based on the reference voltage.

* * * * *